United States Patent [19]

Wilhelm

[11] 4,367,102
[45] Jan. 4, 1983

[54] METHOD FOR THE MANUFACTURE OF A SUPERCONDUCTOR CONTAINING AN INTERMETALLIC COMPOUNDS

[75] Inventor: Manfred Wilhelm, Nuremberg, Fed. Rep. of Germany

[73] Assignee: Siemens Aktiengesellschaft, Munich, Fed. Rep. of Germany

[21] Appl. No.: 217,398

[22] Filed: Dec. 17, 1980

[30] Foreign Application Priority Data

Jan. 22, 1980 [DE]  Fed. Rep. of Germany ....... 3002177
Jan. 22, 1980 [DE]  Fed. Rep. of Germany ....... 3002196

[51] Int. Cl.$^3$ ............................................. H01L 39/00
[52] U.S. Cl. ..................................... 148/133; 29/599; 148/11.5 F; 148/11.5 Q; 148/127
[58] Field of Search ...................... 148/11.5 R, 11.5 F, 148/11.5 Q, 127, 133, 20.3; 29/599; 427/62

[56] References Cited

U.S. PATENT DOCUMENTS

| | | | |
|---|---|---|---|
| 3,268,362 | 8/1966 | Hanak et al. | 427/62 X |
| 3,556,842 | 1/1971 | Kim | 427/62 X |
| 3,630,769 | 12/1971 | Hart et al. | 427/62 X |
| 3,951,870 | 4/1976 | Economy et al. | 29/599 X |
| 4,010,047 | 3/1977 | Frohmader et al. | 148/133 X |
| 4,018,942 | 4/1977 | Müller et al. | 148/20.3 X |
| 4,037,313 | 7/1977 | Wilhelm | 29/599 |
| 4,044,456 | 8/1977 | Ziegler et al. | 29/599 |
| 4,053,976 | 10/1977 | Scanlan et al. | 29/599 |

*Primary Examiner*—Peter K. Skiff
*Attorney, Agent, or Firm*—Kenyon & Kenyon

[57] ABSTRACT

Disclosed herein is a method for manufacturing a superconductor with a superconductive intermetallic compound by means of techniques employing solid-state diffusion in a heat treatment, wherein, in order to increase the effective current density and the critical current of such a superconductor, either the heat treatment for forming the superconductive compound is carried out in a hydrogen atmosphere, or, alternatively, a thermal post-treatment is carried out in a hydrogen atmosphere after the heat treatment for forming the superconductive compound is performed.

12 Claims, No Drawings

METHOD FOR THE MANUFACTURE OF A SUPERCONDUCTOR CONTAINING AN INTERMETALLIC COMPOUNDS

BACKGROUND OF THE INVENTION

The present invention relates to a method for manufacturing a superconductor having a superconductive intermetallic compound of at least two elements.

In particular, the present invention relates to a method for manufacturing a superconductor having a superconductive intermetallic compound of at least two elements in which an intermediate conductor product is prepared from a first component containing one element of the compound and a second component which is an alloy consisting of a carrier metal and the remaining element or elements of the compound, and in which the intermediate conductor product is subjected to a heat treatment such that the desired intermetallic compound is formed by reaction of the element of the first component with the remaining element or elements of the second component. Such a manufacturing method for a superconductor is known from DE-OS No. 2 056 779.

Superconductive intermetallic compounds consisting of two components, each having one element of the desired intermetallic compound, such as $Nb_3Sn$ or $V_3Ga$, which are of the $A_3B$ type and have A15 crystal structure, have very good superconductor properties and are distinguished particularly by a high critical flux density $B_{c2}$ in a magnetic field, a high transition temperature $T_c$ and a high critical current density $I_c$. They are, therefore, particularly well suited as conductors for superconductor coils for producing strong magnetic fields. In addition, ternary compounds such as niobium-aluminum-germanium $Nb_3(Al_xGe_{(1-x)})$, are of special interest. Since these compounds are generally very brittle, however, it is very difficult to produce them in a form suitable, for example, for magnet coils. From the mentioned DE-OS No. 2 056 779, a method is known which makes possible the manufacture of superconductors with intermetallic compounds of two components in the form of long wires or ribbons. This method serves in particular for the manufacture of so-called multicore conductors with wires arranged in a normal-conducting matrix, for example, of $Nb_3Sn$ or $V_3Ga$ or with niobium or vanadium wires with surface layers of these compounds. Thus, a ductile element of the compound to be produced, in wire form, for example, a niobium or a vanadium wire, is surrounded by a jacket of ductile matrix material which contains a predetermined amount of the other elements in the form of an alloy, for example, of a tin or gallium bronze. A mulitiplicity of such wires also can be embedded in the matrix. The structure so obtained is then subjected to a cross section-reducing process and cut into a predetermined number of sections. These sections then are bunched together and again brought into an elongated form through cross section reduction. Through the cross section reductions, the diameter of the wire cores (consisting, for example, of niobium or vanadium) is reduced to a low value in the order of 10 $\mu m$ or less, which is advantageous in view of the superconductor properties of the conductor. With this process step, a good metallurgical bond is obtained between the wire cores and the matrix material surrounding them without the occurrence of reactions which would embrittle the conductor. Thus, a not yet fully reacted intermediate product of the superconductor in the form of a long wire is obtained such as is subsequently required for the winding of coils. This intermediate product is finally subjected to an annealing treatment in vacuum or in an atmosphere of an inert gas such as argon, where element or elements of the superconductive compound to be formed, contained in the matrix, diffuse into the material of the wire cores, consisting of the other element of the compound, and thus react with the latter, forming a layer consisting of the desired superconductive compound.

It has been attempted repeatedly to increase the current carrying capacity of such multicore conductors by special alloying additives. Thus, small amounts of tantalum have been added to the core material niobium (IEEE Trans. Magnetics, MAG-14, No. 5, September 1978, pages 611 to 613). It is further known to add small amounts of gallium to a bronze matrix (J. Appl. Phys. 49(1), January 1978, pages 357 to 360). While an increase of the critical current density of the superconducting $Nb_3Sn$ layers can be achieved with these measure, particularly in magnetic fields with flux densities above 10 Tesla, the workability of one or the other conductor components is generally made more difficult by these additions, particularly due to alloy precipitation hardening.

SUMMARY OF THE INVENTION

It is accordingly an object of the present invention to improve the known method for manufacturing a superconductor containing an intermetallic compound in such a manner that an increase of the critical current, and thus of the effective current density, of the superconductor in magnetic fields at a flux density above 10 Tesla is obtained without adversely affecting the workability of the conductor components.

According to a first embodiment of the present invention, this object is achieved by providing that the heat treatment performed in the known method is conducted in a hydrogen atmosphere.

The advantages of this process step are, in particular, that through the annealing in hydrogen instead of argon or vacuum, the effective current density of the superconductive intermetallic compound layers produced increases in magnetic fields with flux densities above 10 Tesla. This surprising effect is found if the diffusion anneal, i.e., the heating which is conducted after the separate components containing the elements of the desired intermetallic compound are brought together and subjected to cross-section reduction, takes place exclusively in hydrogen. If the doping with hydrogen is compared with the known doping by metallic additives, hydrogen doping can be carried out substantially more easily, since neither the core material nor the conductor matrix need be modified before processing.

According to a second embodiment of the present invention, the same object is attained by providing that thermal post-treatment in a hydrogen atmosphere be performed subsequent to the heat treatment conducted for forming the superconductive compound.

The advantages achieved in accordance with this second embodiment are, in particular, that the effective current density of the so-produced layers of the superconductive intermetallic compound is increased, particularly in magnetic fields with flux densities above 10 Tesla. This surprising effect occurs if the superconductors are post-annealed for a short time in hydrogen after the customary anneal in, for example, argon. If the doping with hydrogen is compared with the known doping by metallic additives, the hydrogen doping can be carried out substantially more easily, since neither the core material nor the conductor matrix need be modified before processing. In addition, magnet coils which have already been wound from superconductors annealed in argon can be subjected to such a post-anneal in hydrogen in order to thereby increase the current-carrying capacity of their conductors.

DETAILED DESCRIPTION OF THE INVENTION

Further explanation and details with respect to the methods according to the present invention are provided wit reference to the following embodiment examples and the tables.

The examples are based on a manufacturing method of wire samples of an $Nb_3Sn$ multi-filament conductor with 10,000 filaments and an overall diameter of 0.5 mm, the superconducting zones of which are formed by solid-state diffusion by means of the known bronze technique (See DE-OS No. 2 052 323).

EXAMPLE I

For comparison purposes, a corresponding intermediate conductor product was subjected to a generally known standard anneal at 700° C. for about 64 hours in an argon atmosphere of 0.5 bar.

EXAMPLE II

Instead of the anneal in an argon atmosphere of the intermediate conductor product as per Example I, two intermediate conductor products were annealed according to the present invention for about 64 hours at 700° C. in a hydrogen atmosphere of about 0.3 bar.

The critical current $I_c$ and effective current density $J_{eff}$ obtained in accordance with the Examples I and II above are given in the following table as a function of magnetic fields with flux densities acting thereon above 10 Tesla, where $J_{eff}=I_c/F$, F being the cross sectional area of the conductor.

The critical currents $I_c$ are given in amps and the effective current densities $J_{eff}$ in $10^{-5}$ A/cm$^2$.

TABLE I

| | | B [T] | | |
|---|---|---|---|---|
| | 10 | 11 | 12 | 15 |
| Example I: | Standard Anneal 64h/700° C. (0.5 bar Ar) | | | |
| $I_c$ | 171 | 135 | 108 | 45 |
| $J_{eff}$ | 0.87 | 0.69 | 0.55 | 0.23 |
| Example II: | 64h/700° C. (0.3 bar H$_2$) | | | |
| Conductor 1: $I_c$ | 164 | 135 | 111 | 57 |
| $J_{eff}$ | 0.84 | 0.69 | 0.57 | 0.29 |
| Conductor 2: $I_c$ | 167 | 138 | 113 | 57.7 |
| $J_{eff}$ | 0.85 | 0.70 | 0.58 | 0.29 |

As can be seen from the Table, the gain in effective current density attainable according to the invention is about 4 to 6% at flux densities of 12 Tesla and about 26% at 15 Tesla.

It was further found that the values of the critical current $I_c$ and of the effective current density $J_{eff}$ attainable according to the present invention are increased only at flux densities above 10 Tesla over the values for the conductors annealed in argon or in a vacuum. The conductors manufactured by the first method according to the invention are, therefore, most advantageously provided for superconducting devices such as magnet coils where they are subjected to magnetic fields with flux densities above 10 Tesla.

In the fabrication of the conductors according to the present invention, on which Example II was based, it was assumed that the heat treatment in te hydrogen atmosphere consists of a single treatment stage at a predetermined temperature. Optionally, several treatment stages at different temperatures also can be carried out in the hydrogen atmosphere. A pressure of about 0.3 bar was furthermore assumed. For raising the critical current $I_c$ above 10 Tesla, however, lower pressures also are sufficient. In general, however, the pressure of the hydrogen atmosphere should be at least $10^{-3}$ bar.

In general, a gain in effective current density over the superconductors treated in accordance with Example I can be obtained if a temperature of at least about 600° C., but preferably of about 700° C., is chosen; at the lower temperatures, the anneal time generally must be longer than at the high temperatures.

According to the first embodiment of the invention outlined in Example II, the heat treatment of the intermediate conductor products for forming the superconducting intermetallic compound was carried out in a hydrogen atmosphere in order to increase the critical current and the effective current density. According to a second embodiment of the invention, however, this objective also can be achieved if a thermal post-treatment in a hydrogen atmosphere is carried out only after the heat treatment for forming the superconductive compound. Appropriate process steps are outlined in Examples III to VII.

EXAMPLES III TO VI $Nb_3Sn$ diffusion conductors prepared in accordance with Example I were subjected, according to the invention, additionally to a post-anneal in a hydrogen atmosphere of about 0.3 bar at 700° C. where, according to Example III, the anneal in the hydrogen atmosphere was carried out for about 64 hours; according to Example IV about 8 hours; according to Example V about 4 hours and according to Example VI about 2 hours.

The critical currents $I_c$ and effective current densities $J_{eff}$ obtained in accordance with the Examples III to VI above are given in the following Table II as a function of magnetic fields acting thereon with flux densities B above 10 Tesla; for comparison purposes, the corresponding values from Example I are likewise given. Here, $J_{eff}=I_cF$, F being the cross sectional area of the conductor. The critical currents $I_c$ are given in amps and the effective current density $J_{eff}$ in $10^{-5}$ A/cm$^2$.

TABLE II

| Example No. | | B [T] | | |
|---|---|---|---|---|
| | 10 | 11 | 12 | 15T |
| I | Standard Anneal: 64h/700° C. (0.5 bar Ar) | | | |
| $I_c$: | 171 | 135 | 108 | 45 |
| $J_{eff}$: | 0.87 | 0.69 | 0.55 | 0.23 |
| III | 64h/700° C. (0.5 bar Ar) + 64h/700° C. (0.3 bar H$_2$) | | | |
| $I_c$: | 170 | 140 | 115 | 60 |
| $J_{eff}$: | 0.87 | 0.71 | 0.59 | 0.31 |
| IV | 64h/700° C. (0.5 bar Ar) + 8h/700° C. (0.3 bar H$_2$) | | | |
| $I_c$: | 174 | 144 | 118 | 61 |
| $J_{eff}$: | 0.89 | 0.73 | 0.60 | 0.31 |
| V | 64h/700° C. (0.5 bar Ar) + 4h/700° C. (0.3 bar H$_2$) | | | |
| $I_c$: | 173 | 143 | 117 | 59 |
| $J_{eff}$: | 0.88 | 0.73 | 0.60 | 0.30 |
| VI | 64h/700° C. (0.5 bar Ar) + 2h/700° C. (0.3 bar H$_2$) | | | |
| $I_c$: | 174 | 144 | 118 | 59 |

TABLE II-continued

| Example No. | B [T] | | | |
|---|---|---|---|---|
| | 10 | 11 | 12 | 15T |
| $J_{eff}$ | 0.89 | 0.73 | 0.60 | 0.30 |

As can be seen from the Table above, the gain obtained according to this embodiment of the invention as to the effective current density is up to 9% at flux densities of 12 Tesla and up to 35% at 15 Tesla.

It was further found that the values of the critical current $I_c$ and the effective current density $J_{eff}$ obtainable according to the invention are generally increased over the values for the conductors annealed only in argon or in a vacuum only at flux densities above 10 Tesla. The conductors fabricated by the method according to the invention are, therefore, most advantageously provided for superconducting devices such as magnet coils, where they are subjected to magnetic fields with flux densities above 10 Tesla.

In the manufacture of the conductors according to the present invention, such as those on which Examples III to VI were based, it was assumed that the pressure of the hydrogen atmosphere is approximately 0.3 bar. However, lower pressures also may be provided, and, in general, it is sufficient for raising the critical current density $I_c$ above 10 Tesla if the pressure of the hydrogen atmosphere is at least about $10^{-3}$ bar. It was further assumed that the heat treatment in the hydrogen atmosphere consists of a single treatment stage at a predetermined temperature. Optionally, however, several treatment stages at different temperatures also can be carried out in the hydrogen atmosphere. The temperature dependance was investigated in accordance with the following example.

EXAMPLE VII

The intermediate conductor product of an $Nb_3Sn$ multi-filament conductor was first annealed in accordance with Example I for 64 hours at 700° C. in argon to form the superconductive intermetallic compound $Nb_3Sn$. Subsequently, various post-anneals were carried out in a hydrogen atmosphere at 0.3 bar, and specifically, at temperatures between 300° C. and 800° C. for periods between 20 hours and 1 hour. It was found that a gain in effective current density over the superconductors treated in accordance with Example I can be obtained if a temperature above 350° and preferably of about 400° C. or about 700° C. is chosen, where at the lower temperatures, generally longer annealing times must be provided than at high temperatures.

According to the examples, the manufacture of superconducting multi-filament conductors with the intermetallic compound $Nb_3Sn$ was assumed. The method according to the invention is equally well suited, however, for the manufacture of superconductors of other known intermetallic compounds by means of solid-state diffusion, such as of $V_3Ga$ conductors.

What is claimed is:

1. In a method for manufacturing a superconductor containing a superconductive intermetallic compound of at least two elements, wherein an intermediate conductor product is prepared by bringing into contact (a) a first component, in the form of at least one ductile wire or rod, containing one element of the desired intermetallic compound and (b) a second component, in the form of a jacket or matrix into which said first component is embedded, consisting of an alloy of a carried metal and the remaining elements of the desired intermetallic compound, and wherein said intermediate product is subjected to one or more cross-section reducing processes and thereafter subjected to a heat treatment sufficient to effect solid-state diffusion of said remaining elements into said element of the first component and to effect a reaction therebetween so as to form said intermetallic compound, the improvement comprising conducting said heat treatment in a hydrogen atmosphere thereby to effect hydrogen doping of the superconductor intermetallic compound.

2. The method according to claim 1 wherein said heat treatment is conducted at a temperature of at least about 600° C.

3. The method according to claim 2 wherein said heat treatment is conducted at a temperature of about 700° C.

4. The method according to claim 1 wherein the pressure of said hydrogen atmosphere is at least about $10^{-3}$ bar.

5. The method according to claim 1 wherein said heat treatment comprises a step-wise treatment wherein there is conducted a first heat treatment at a specified temperature and at least one additional heat treatment at a different temperature than employed in said first treatment.

6. In a method for manufacturing a superconductor containing a superconductive intermetallic compound of at least two elements, wherein an intermediate conductor product is prepared by bringing into contact (a) a first component, in the form of at least one ductile wire or rod, containing one element of the desired intermetallic compound and (b) a second component in the form of a jacket or matrix into which said first component is embedded, consisting of an alloy of a carried metal and the remaining elements of the desired intermetallic compound, and wherein said intermediate product is subjected to one or more cross-section reducing processes and thereafter subjected to an initial heat treatment sufficient to effect solid-state diffusion of said remaining elements into said element of the first component and to effect a reaction therebetween so as to form said intermetallic compound, the improvement comprising subjecting said heat treated conductor product, after said initial heat treatment, to a thermal post-treatment process in a hydrogen atmosphere thereby to effect hydrogen doping of the superconductor intermetallic compound.

7. The method of claim 6 wherein said thermal post-treatment comprises subjecting said heat treated conductor product, after said initial heat treatment, to a temperature of above about 350° C. in a hydrogen atmosphere.

8. The method according to claim 6 wherein the pressure of said hydrogen atmosphere is at least about $10^{-3}$ bar.

9. The method according to claim 6 wherein said thermal post-treatment is conducted in a step-wire manner with at least two post-treatment steps at differing temperatures.

10. The method according to claim 6 wherein said initial heat treatment is conducted in either an argon atmosphere or in a vacuum.

11. In a method for manufacturing a superconductor containing the superconductive intermetallic compound $Nb_3Sn$, wherein an intermediate conductor product is prepared by bringing into contact (a) a first component, in the form of at least one ductile wire or rod, containing niobium and (b) a second component, in the form of a jacket or matrix into which said first component is embedded, consisting of a tin-copper alloy, and wherein said intermediate product is subjected to one or more cross-section reducing processes and thereafter subjected to a heat treatment sufficient to effect solid-state diffusion of said tin into said niobium and to effect a reaction therebetween so as to form said $Nb_3Sn$ compound, the improvement comprising conducting said heat treatment in a hydrogen atmosphere.

12. In a method for manufacturing a superconductor containing the superconductive intermetallic compound $Nb_3Sn$, wherein an intermediate conductor product is prepared by bringing into contact (a) a first component, in the form of at least one ductile wire or rod, containing niobium and (b) a second component, in the form of a jacket or matrix into which said first component is embedded, consisting of a tin-copper alloy, and wherein said intermediate product is subjected to one or more cross-section reducing processes and thereafter subjected to an initial heat treatment sufficient to effect solid-state diffusion of said tin into said niobium and to effect a reaction therebetween so as to form said $Nb_3Sn$ compound, the improvement comprising subjecting said heat treated conductor product, after said initial heat treatment, to a thermal post-treatment process in a hydrogen atmosphere.

* * * * *